(12) United States Patent
Lin

(10) Patent No.: US 6,797,457 B2
(45) Date of Patent: Sep. 28, 2004

(54) METHOD FOR IMPROVING THE RESOLUTION OF OPTIC LITHOGRAPHY

(75) Inventor: Chih-Yung Lin, Hsin-Chu (TW)

(73) Assignee: United Microelectronics Corp. (TW)

(*) Notice: Subject to any disclaimer, the term of this patent is extended or adjusted under 35 U.S.C. 154(b) by 124 days.

(21) Appl. No.: 10/119,688

(22) Filed: Apr. 11, 2002

(65) Prior Publication Data

US 2003/0087202 A1 May 8, 2003

Related U.S. Application Data

(60) Provisional application No. 60/336,202, filed on Oct. 31, 2001.

(51) Int. Cl.[7] .................................................. G03F 7/00
(52) U.S. Cl. ....................... 430/318; 430/311; 430/313
(58) Field of Search ................................ 430/311, 313, 430/317, 318, 322

(56) References Cited

PUBLICATIONS

"Aluminum Etch Mask for Plasma Etching", IBM Technical Disclosure Bulletin, Aug. 1978, vol. 21, issue 3, pp. 1256–1258.*

* cited by examiner

*Primary Examiner*—Kathleen Duda

(57) ABSTRACT

A method for improving the resolution of optic lithographic is disclosed. The method includes a step of forming an etched layer on the substrate, an inorganic photoresist layer is spun-on the etched layer, and an atomic layer on the inorganic photoresist layer. Then, a deep ultraviolet light is illuminated to the inorganic photoresist layer such that the acid molecular is formed from inorganic photoresist layer. Next, the atomic layer is catalyzed by acid molecular and converted to metallic oxide by active oxygen atom. After oxidation, the oxide pattern can be obtained and it is easy by etching process.

21 Claims, 5 Drawing Sheets

METHOD FOR IMPROVING THE RESOLUTION OF OPTIC LITHOGRAPHY

This application claims the benefit of Provisional Application No. 60/336,602 filed Oct. 31, 2001.

BACKGROUND OF THE INVENTION

1. Field of the Invention

The present invention generally relates to a method for improving the resolution of optic lithography, and more particularly to an ultraviolet light illumination method for treating the photoresist layer.

2. Description of the Prior Art

Lithographic processes are used in manufacture of semiconductor devices, such as integrated circuit chips and read/write heads for magnetic media drivers, e.g. disc drives and tape drives. Lithographic processes typically involve a step of depositing a layer of a photo resist material onto a device such as a silicon wafer by e.g. spin-coating. Next comes a selectively exposing portion of the photo resist layer to radiation, e.g. ultraviolet, X-ray or ion or electron beam. The last step includes developer solution, e.g. tetramethylammonium hydroxide (TMAH), thereby removing the non-irradiated portions of a negative photo resist or irradiated portions positive photo resist.

The modern semiconductor industry's continuing drive toward integrated circuits with ever decreasing geometries, coupled with its pervasive use of highly reflective materials, such as polysilicon, aluminum, and metal suicides, has led to increase the photolithographic patterning problems. Unwanted reflections from these underlying materials, during the photoresist patterning process, cause the resulting photoresist patterns to be distorted.

This problem is further compounded when photolithographic imaging tools having ultraviolet (UV) and deep ultraviolet (DUV) exposure wavelengths are used to generate the photoresist patterns. Although shorter wavelengths bring improved resolution by minimizing diffraction limitations, and resulting patterns generated in the photoresist are easily compromised by the effects of uncontrolled reflections from underlying materials due to the increased optical metallic nature of underlying reflective materials at these wavelengths. Moreover, photoresist patterns are particularly degraded in areas where the topology of the underlying reflective material changes. In these stepped areas, the reflection intensity from underlying materials is often enhanced and results in a locally distorted photoresist pattern near the stepped areas. Therefore, the formation of sub-micron photoresist patterns over semiconductor substrates is difficult to achieve, and as a result, fabrication of advanced integrated circuits with sub-micron geometries is limited.

In conventional wafer patterning process, the organic polymer type photosensitivity material is used as a media for mask pattern transferred through etching process to wafer. But the integrity of organic polymer type photosensitivity material will nit be maintained, due to the short wavelength radiation such as deep UV is illuminated to organic photo resist layer, the chemical bond of organic photo resist layer is broken by photochemical reaction. Such that the cost of photo resist layer is increased. The other disadvantages are that the optic lithography is in order to improve the resolution of optic lithography by reducing wavelength of illumination. When the radiation wavelength is lower, the organic polymer photoresist will be degraded, the out-gassing is generated, and the lens of exposure tools is contaminated and the resolution of optic lithographic is degraded.

SUMMARY OF THE INVENTION

It is an object of this invention to use an inorganic photoresist layer formed on the wafer to avoid the chemical bond is broken by illumination.

It is another object of this invention to improve the out-gassing during the fabrication for optical lithography process.

It is still another object of this invention to improve the resolution of optical lithography process.

It is still another object of this invention to reduce the cost of photoresist layer in the integrated circuit fabrication.

In accordance to above-mentioned objects, in one preferable embodiment, an etched layer, an inorganic photoresist layer, and an atomic layer are sequentially formed on a substrate. Then, an ultraviolet light is illuminated through the reticle to the inorganic photoresist layer. The chemical bond of inorganic photoresist layer cannot be broken, and the out-gassing will not be occurred. The inorganic photoresist layer is produced acid molecular after illumination and the acid molecular is used to catalyze the atomic layer. Then, the atomic layer under exposure area has oxidation with active oxygen atom after catalyze. After oxidation, the oxide pattern can be obtained and the etching process is easy to etch and no out-gassing is generated.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

An optical lithography tool consist of ultraviolet (UV) light source, a photomask, an optical system, and a wafer covered with a photosensitive layer, called resist because of its ability to resist chemicals used in subsequent processing. The mask flooded with UV light and the mask pattern is imaged onto the resist by the optical system.

The most commonly used ultraviolet light sources for optical lithography are high-pressure arc lamps and laser sources. Three regions of the emitted light spectrum can be distinguished: deep ultraviolet (DUV) in the 100–300 nm range, mid-UV in the 300–360 nm range, and near-UV in the 360–450 nm range.

In this embodiment is provided a substrate and an etched layer thereon, an inorganic photoresist layer on the etched layer, and an atomic layer on the inorganic photoresist layer. Then, an ultraviolet light source with wavelength about 157 nm (nanometers) is illuminated through the reticle to the inorganic photoresist layer to form the acid molecular, and the oxygen gas is decomposed to form active oxygen atom simultaneously. The acid molecular is used as a catalyst to catalyze the atomic layer and the active oxygen atom is used to oxidize the atomic layer to form a metallic oxide. Then, an etching process is performed on the atomic layer to etch the metallic oxide. Next, the atomic layer is used as photomask, the inorganic photoresist layer and the etched layer are sequentially etched. The advantage for this invention is that the chemical bonds of inorganic photoresist layer will not be broken when the UV light is illuminated, and the cost of fabrication can be reduced. Another advantage is the oxide pattern can be obtained and the etching process patterning is easy performed.

Figure 1:
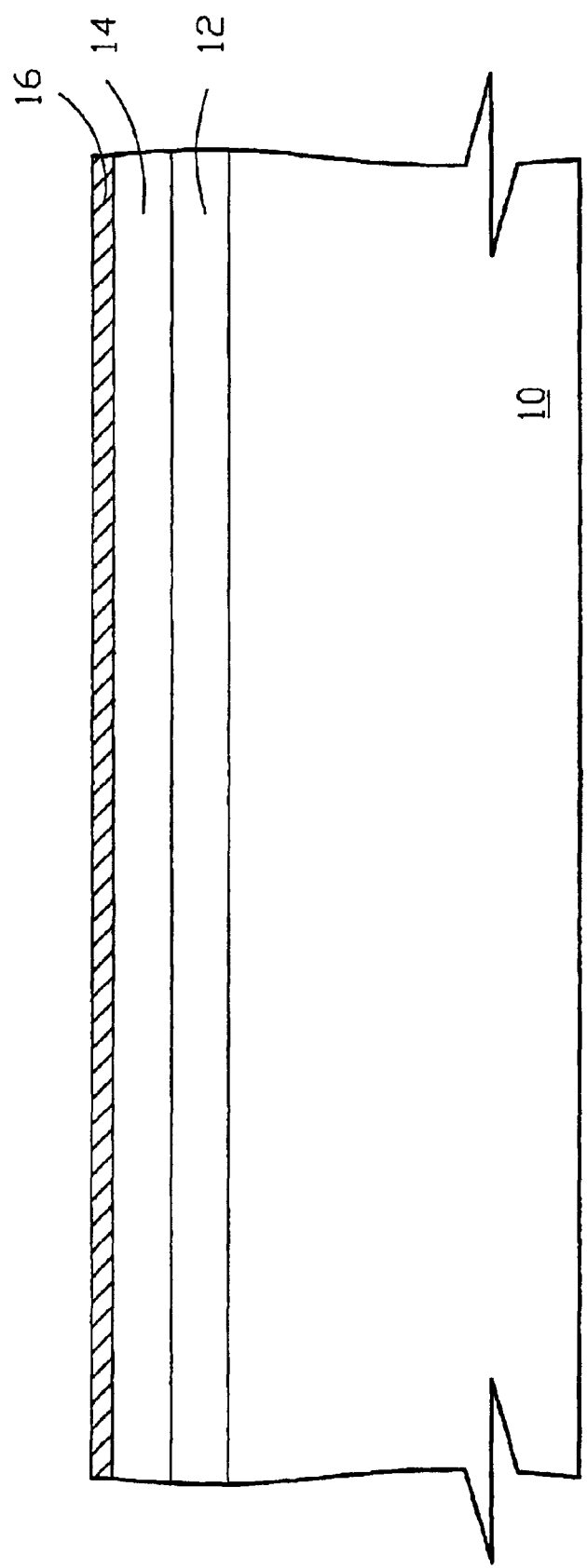
FIG. 1 is schematic representations the structures for forming an etched layer, an inorganic photoresist layer, and an atomic layer on the semiconductor substrate in accordance with a method disclosed herein.

Referring to FIG. 1, an etched layer 12 is deposited on the substrate 10, wherein the material of the etched layer can be oxide or polysilicon. Then, an inorganic photoresist layer 14 is spun-on the etched layer 12, wherein the inorganic photoresist layer 14 is PAG layer (photo acid generator layer). The PAG layer is composed of photo acid generating compounds which generate acid upon exposure to radiation to provide photosensitive photo resist compositions useful in ultraviolet light, and an atomic layer 16 is spun-on the inorganic photoresist layer 14, wherein the material atomic layer 16 can be aluminum or aluminum alloys.

The most powerful and commonly used laser sources for the deep UV photolithography are the excimer laser. The word "excimer" combines the two words "excited" and "dimer". A dimer is a molecule composed of two identical atoms such as $Kr_2$. The word "excimer", however, is also used to describe excited complexes such as rare gas halides, e.g., KrF (krypton-fluoride), XeCl (xenon-chloride), and ArF (argon fluoride). In this preferable embodiment, the laser source for deep UV photolithography is $F_2$ (fluoride). The wavelength from excimer laser is about 157 nm (nanometer). The resolution for $F_2$ about 100 to 70 nm is superior to the ArF, which is about 130 to 100 nm.

Figure 2:
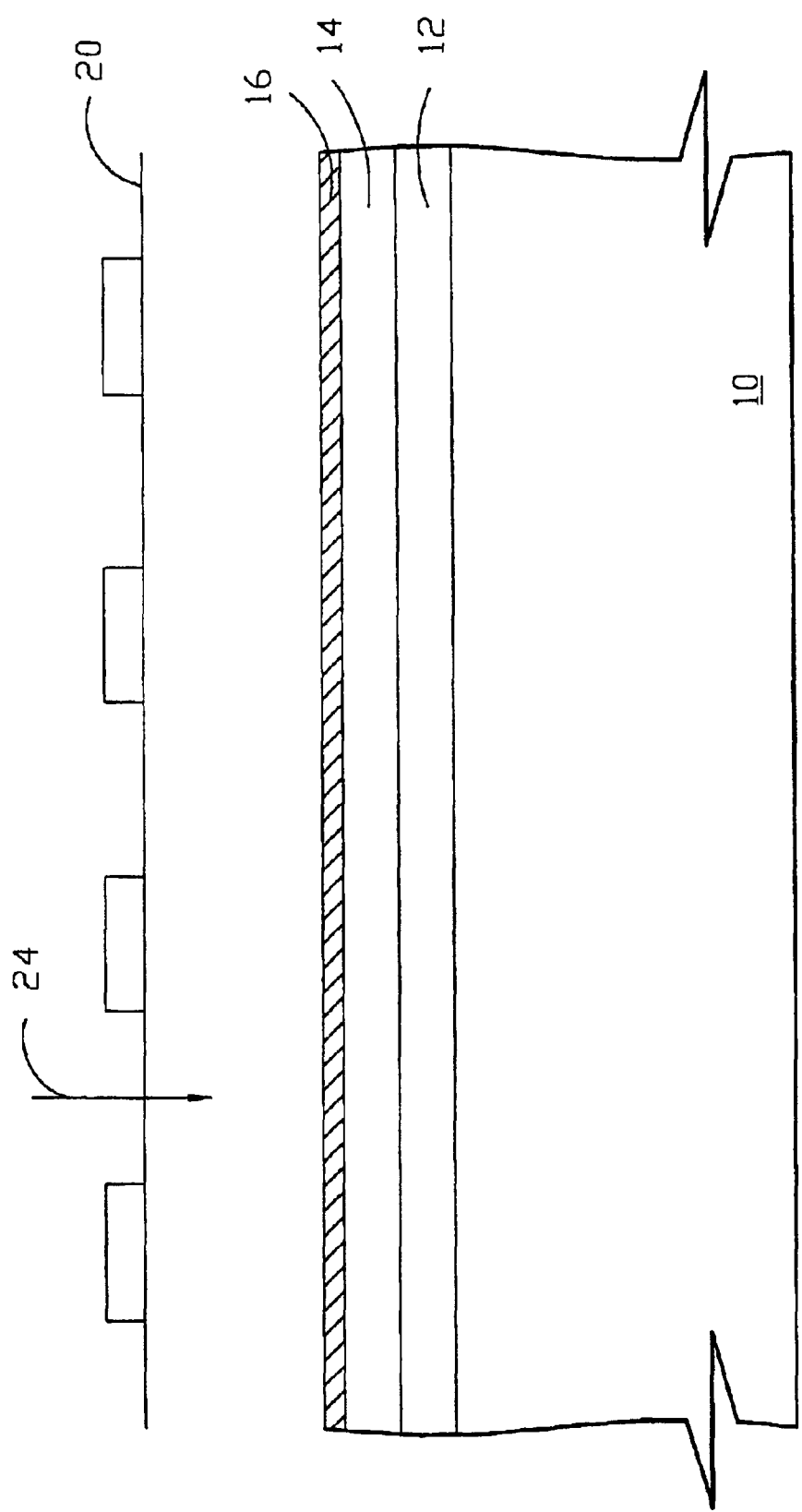
FIG. 2 is a cross-sectional view showing a reticle over the structure of FIG. 1 in accordance with a method disclosed herein.
Figure 3:
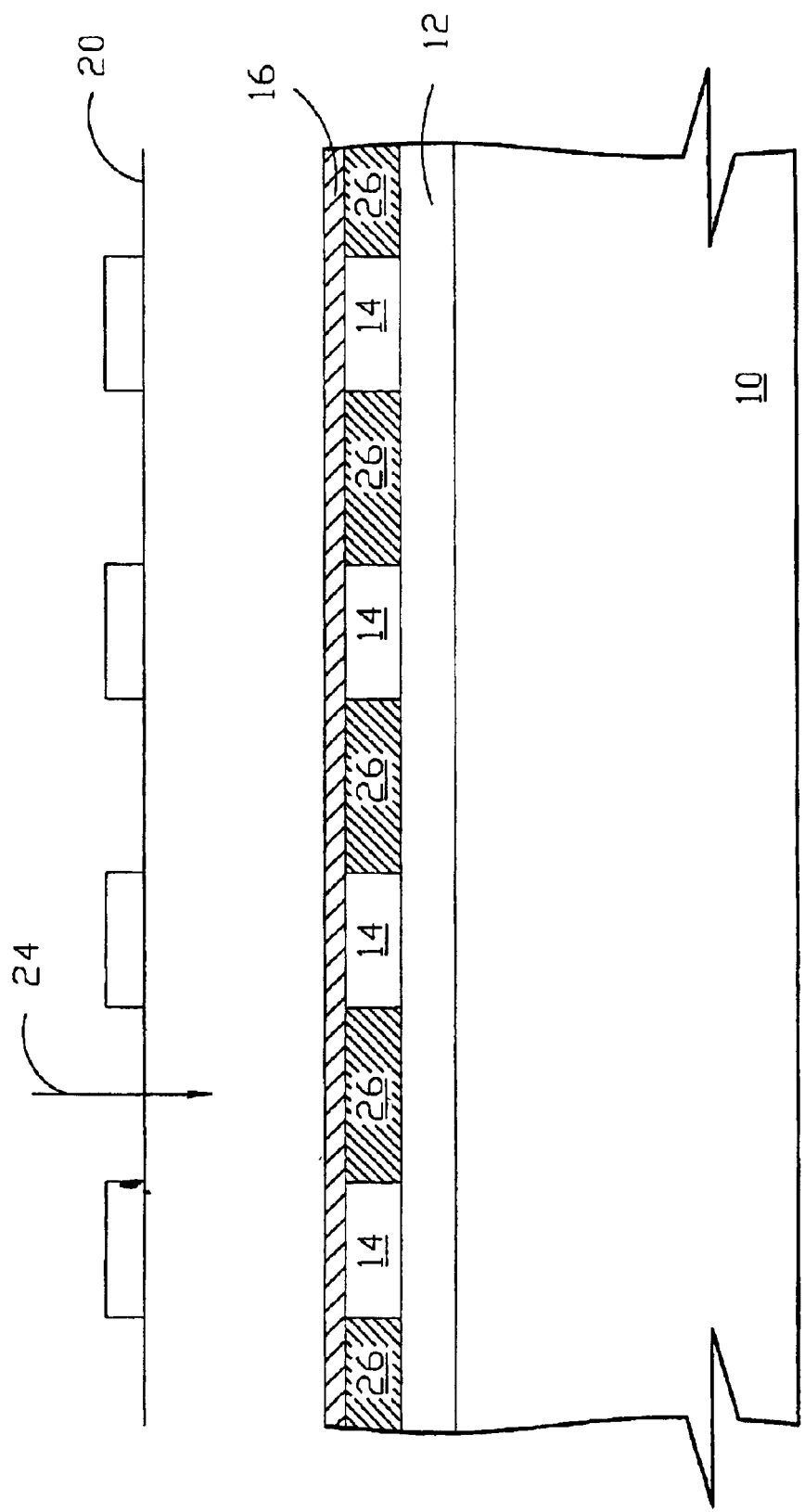
FIG. 3 is schematic representation an ultraviolet light is illuminated through the reticle to inorganic photoresist layer in accordance with a method disclosed herein.

Referring to FIG. 2 and FIG. 3, a deep ultraviolet light 24 with wavelength about 157 nm is illuminated through the reticle 20 to the inorganic photoresist layer 14. Then, the acid molecular is formed from the inorganic photoresist layer 20 on the illumination area 26 and under the atomic layer 16 by ultraviolet light 24 illuminations. The acid molecular is called Lewis acid and used as a catalyst to catalyze the atomic layer 16. When the ultraviolet light 24 is illuminated, the oxygen gas is also decomposed to form active oxygen atom. The active oxygen atom is used to oxidize the atomic layer 16, after the atomic layer 16 is catalyzed.

Figure 4:
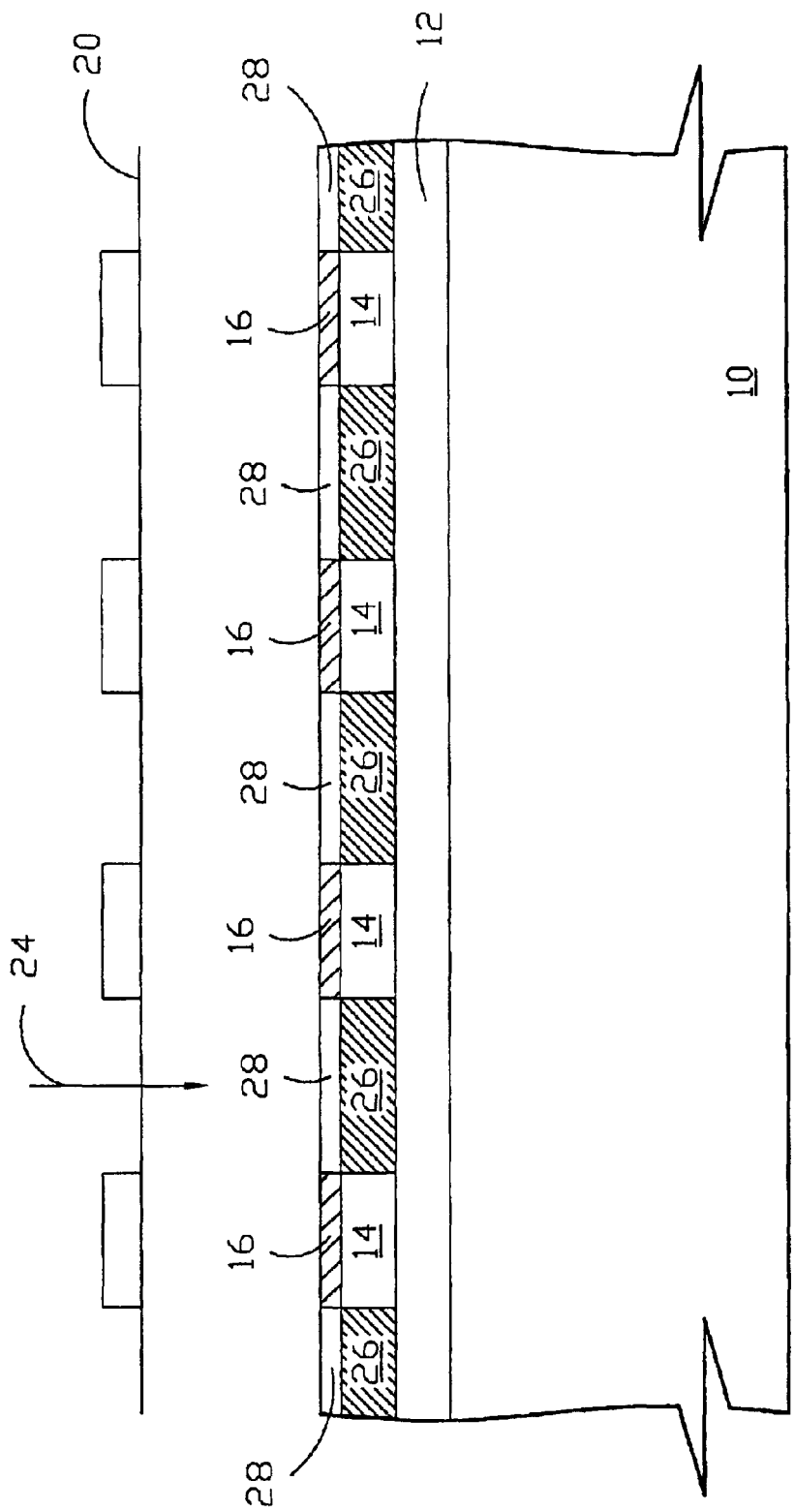
FIG. 4 is schematic representation the atomic layer is catalyzed by acid from inorganic photoresist layer on illumination area of structure of FIG. 3 in accordance with a method disclosed herein.
Figure 5:
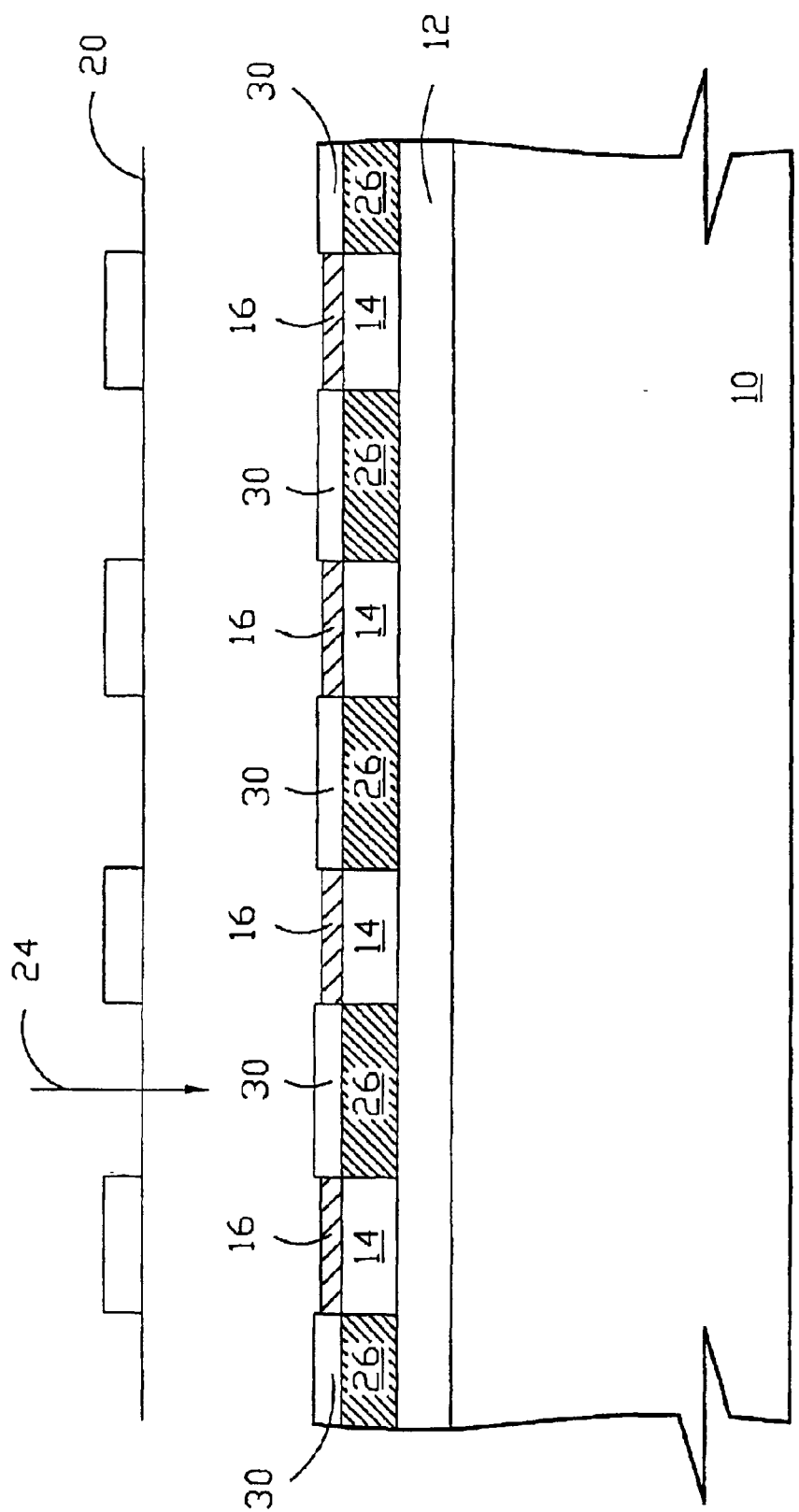
FIG. 5 is schematic representation the metallic oxide is formed from the oxidation on illumination area of structure of FIG. 4 in accordance with a method disclosed herein.

Referring to FIG. 4 and FIG. 5, the atomic layer 28, which is catalyzed under exposure area, has oxidation with active oxygen atom. After oxidation, the metallic oxide 30 is formed on the atomic layer 16, which the formula can be written the $B_xO_y$, wherein the B is metallic atom and O is oxygen atom and the oxide pattern can be obtained.

Then, an etching process is performed on the atomic layer 16 to etch away the metallic oxide 30. Then, the portion of atomic layer 16, which is not be etched, is used as etching mask, the inorganic photoresist layer 14 and etched layer 16 are sequentially etched by etching process.

According to aforementioned description, in a preferable embodiment is provided a inorganic photoresist layer spun-on the etched layer and an atomic layer formed on the inorganic photoresist layer. When a UV light is illuminated through the reticle to the inorganic photoresist layer, the chemical bonds of inorganic photo resist layer will not be broken by illumination such that the integrity and reliability of photo resist layer can be maintained, furthermore, the cost of photo resist layer is also to be reduced. Then, the acid molecular is generated from inorganic photoresist layer is used to catalyze the atomic layer and the oxygen gas is decomposed to form active oxygen atom to oxidize the atomic layer. After oxidation, the oxide pattern can be obtained and the etching process patterning is easy performed.

Although specific embodiments have been illustrated and described, it will be obvious to those skilled in the art that various modifications may be made without departing from what is intended to be limited solely by the appended claims.

What is claimed is:

1. A method for treating inorganic photoresist layer, said method comprising:

providing an inorganic photoresist layer on a substrate and an atomic layer on said inorganic photoresist layer, wherein said inorganic photoresist layer being used to provide a plurality of acidic molecule;

illuminating an ultraviolet light to said inorganic photoresist layer such that said pluralities of acidic molecule is formed from said inorganic photoresist layer;

oxidizing said atomic layer on an illumination area with an active oxygen atom to convert a metallic oxide on said atomic layer.

2. The method according to claim 1, further comprising an etched layer on said substrate.

3. The method according to claim 2, wherein the material of said etched layer is an oxide.

4. The method according to claim 2, wherein the material of said etched layer is polysilicon.

5. The method according to claim 1, wherein said inorganic photoresist layer is a photo acid generator layer (PAG layer).

6. The method according to claim 1, further comprising a plurality of active oxygen atom formed after the step of said illuminating said ultraviolet light to said inorganic photoresist layer such that said plurality of acidic molecule is formed from said inorganic photoresist layer.

7. The method according to claim 1, wherein said ultraviolet light is a deep ultraviolet light.

8. The method according to claim 7, wherein the wavelength of said deep ultraviolet light is about 157 nanometers.

9. The method according to claim 1, wherein the material of said atomic layer is aluminum.

10. The method according to claim 9, wherein the material of said atomic layer is aluminum alloy.

11. A method for improving the resolution of optic lithography, said method comprising:

providing a substrate having an etched layer thereon, an inorganic photoresist layer on said etched layer, and an atomic layer on said inorganic photoresist layer;

illuminating a deep-ultraviolet light to said inorganic photoresist layer such that a plurality of acidic molecule is produced on an illumination area and the oxygen gas is decomposed to a plurality of active oxygen atom simultaneously;

catalyzing said atomic layer with said plurality of said acid molecule; and oxidizing said atomic layer on said illumination area with said plurality of an active oxygen atom to convert a metallic oxide on said atomic layer.

12. The method according to claim 11, wherein the material of said etched layer is an oxide.

13. The method according to claim 11, wherein the material of said etched layer is polysilicon.

14. The method according to claim 11, wherein said inorganic photoresist layer is a photo acid generator layer.

15. The method according to claim 11, wherein the material of said atomic layer is aluminum.

16. The method according to claim 15, wherein the material of said atomic layer is aluminum alloy.

17. The method according to claim 11, wherein the wavelength of said deep ultraviolet light is about 157 nanometers.

18. A method for improving the resolution of inorganic photoresist layer, said method comprising:

providing a substrate having an oxide layer thereon;

spinning on an inorganic photoresist layer on said oxide layer;

depositing an atomic layer on said inorganic photoresist layer;

illuminating a deep-ultraviolet light to said inorganic photoresist layer such that said inorganic photoresist layer is produced a plurality of acidic molecule on an illumination area and the oxygen gas is decomposed to a plurality of active oxygen atom simultaneously;

catalyzing said atomic layer with said plurality of said acidic molecule; and oxidizing said atomic layer with said plurality of said active oxygen atom on an illumination area to convert a metallic oxide on said atomic layer.

19. The method according to claim 18, wherein the material of said oxide layer is polysilicon layer.

20. The method according to claim 18, wherein the material of said atomic layer is aluminum alloy.

21. The method according to claim 18 wherein said wavelength of said deep-ultraviolet radiation is about 157 nanometers.

* * * * *